United States Patent
Nakagawa et al.

(10) Patent No.: US 6,369,491 B1
(45) Date of Patent: Apr. 9, 2002

(54) SURFACE ACOUSTIC WAVE DEVICE AND METHOD FOR MANUFACTURING THE SAME

(75) Inventors: Masatoshi Nakagawa, Kyoto; Makoto Tose, Shiga-ken; Yoshihiro Koshido, Kanazawa; Michio Kadota, Kyoto; Toshimaro Yoneda, Ishikawa-ken; Takeshi Nakao, Nagaokakyo, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/654,114

(22) Filed: Aug. 31, 2000

(30) Foreign Application Priority Data

Sep. 2, 1999 (JP) .......................... 11-248932

(51) Int. Cl.$^7$ ................................. H03H 9/15
(52) U.S. Cl. .................... 310/364; 310/313 R
(58) Field of Search ............... 310/313 R, 363, 310/364

(56) References Cited

U.S. PATENT DOCUMENTS

| | | | | |
|---|---|---|---|---|
| 4,251,326 A | * | 2/1981 | Arcidiacono et al. ......... | 204/15 |
| 5,162,690 A | * | 11/1992 | Ieki et al. ............... | 310/313 R |
| 5,221,449 A | * | 6/1993 | Colgan et al. ......... | 204/192.15 |
| 5,274,482 A | * | 12/1993 | Morita et al. .................. | 359/54 |
| 6,218,763 B1 | * | 4/2000 | Fujimoto et al. ....... | 310/313 R |
| 6,127,769 A | * | 10/2000 | Kadota et al. .......... | 310/313 B |

FOREIGN PATENT DOCUMENTS

| | | | | |
|---|---|---|---|---|
| EP | 0 024 863 A2 | * | 3/1981 | ........... H01L/27/01 |
| EP | 1 056 199 A2 | * | 11/2000 | ............ H03H/3/08 |
| JP | 61-45892 | | 10/1986 | ............ H03H/9/25 |
| JP | 3-248568 | | 11/1991 | ......... H01L/29/784 |
| JP | 8-125485 | | 5/1996 | .......... H03H/9/145 |
| JP | 10-247835 | | 9/1998 | .......... H03H/9/145 |

OTHER PUBLICATIONS

Tanski, William J., American Institute of Physics, "Surface Acoustic Wave Frequency Trimming of Resonant and Traveling–wave Devices on Quartz," Jul. 1981.

Mizuta, Takayuki, Nippon Electric Company, Ltd., Yokohama, "High–Rate Magnetron RF Sputtering of Tantalum," Dec. 18, 1980.

* cited by examiner

Primary Examiner—Thomas M. Dougherty
(74) Attorney, Agent, or Firm—Keating & Bennett, LLP

(57) ABSTRACT

A surface acoustic wave device includes a piezoelectric plate and at least one interdigital electrode provided on the piezoelectric plate. The interdigital electrode includes a first metallic thin film and a second metallic thin film laminated on the first metallic thin film and containing tantalum as a principal component, and at least a portion of the tantalum of the second metallic thin film is α-tantalum.

10 Claims, 7 Drawing Sheets

SURFACE ACOUSTIC WAVE DEVICE AND METHOD FOR MANUFACTURING THE SAME

BACKGROUND OF THE INVENTION

1. Field of the Invention

The present invention relates to a surface acoustic wave device to be used for, for example, band-pass filters and resonators, and a method for manufacturing the same. More specifically, the present invention relates to a surface acoustic wave device having an interdigital electrode made of tantalum, and a method for manufacturing the same.

2. Description of the Related Art

Surface acoustic wave devices have been widely used for band-pass filters and resonators. The surface acoustic wave device used in these apparatuses are strongly required to have good frequency characteristics and very low cost.

An interdigital electrode including gold is provided on a rotation Y-cut quartz substrate so that the angle between the X-axis and the propagation direction of the surface acoustic wave is about 90° in the surface acoustic wave device disclosed in Japanese Examined Patent Application Publication No. 61-45892.

Japanese Unexamined Patent Application Publication No. 8-125485 discloses a surface acoustic wave device having an interdigital electrode including tantalum.

Japanese Unexamined Patent Application Publication No. 10-247835 also discloses a surface acoustic wave device having an aluminum layer defining a substrate and a bilayer structure interdigital electrode including a tantalum layer laminated on the aluminum layer.

It is desirable that distribution of a center frequency of the surface acoustic wave device is as small as possible, when a narrow band-pass filter is constructed using the surface acoustic wave device. Accordingly, fine-tuning of the frequencies has been required after completing the manufacturing process of the surface acoustic wave device to be used for the narrow band-pass filter.

A typical method for tuning the frequencies as described above includes fine-tuning the frequencies by dry-etching the interdigital electrode with plasma and a gas including $CF_4$ and $O_2$ (Applied Physics Letters, 30(1), p40 (July 1981)).

For example, while the maximum shift of the center frequency is usually about 300 ppm when manufacturing the surface acoustic wave device having the quartz substrate, it is possible to change the frequency by a maximum of about 500 ppm using the frequency tuning method described above, and the shift of the center frequency is considered to be finally suppressed within about 50 ppm.

The operating frequency of the surface acoustic wave device is generally determined by an equation of $f=v/\lambda$ (where v denotes a propagation velocity of the surface acoustic wave and $\lambda$ denotes the wavelength of the surface wave). The wavelength $\lambda$ depends on the structure of the interdigital electrode, which is usually manufactured by a technique using photolithography. The technique usually includes a combination of a thin-film deposition method such as a chemical deposition method like CVD or a physical deposition method like sputtering or vapor deposition method, and an etching process. These techniques are repeated, if necessary.

When gold is used for the material of the interdigital electrode as in the surface acoustic wave device described in Japanese Examined Patent Application Publication No. 61-45892, a problem occurs in that the adhesive property between the electrode including gold and a piezoelectric plate is insufficient. In addition, gold is so expensive that the material cost becomes too high causing a greatly increased cost of the surface acoustic wave device.

Cost reduction is possible by using tantalum as the material of the interdigital electrode as disclosed in Japanese Unexamined Patent Application Publication No. 8-125485. Since tantalum is a metal having a high melting point, it can be deposited by a physical deposition method such as sputtering. However, since the tantalum film formed by the method as described above has a crystal structure of β-tantalum, its resistivity is as high as about 180 $\mu\Omega\cdot$cm at room temperature. Accordingly, characteristics of the surface acoustic wave device, especially insertion loss, are worsened because electric resistance of the electrode increases.

Accordingly, a method disclosed in Japanese Unexamined Patent Application Publication No. 10-247835 has been proposed, wherein an aluminum layer having a good electrical conductance is provided on the substrate of the electrode layer including tantalum. However, it is impossible to sufficiently decrease the resistivity of the overall interdigital electrode due to high resistivity of the tantalum film.

In the case of the interdigital electrode having a multilayer structure, an electromechanical coupling coefficient is decreased depending on the metallic material constituting a substrate. As a result, the characteristics of the surface acoustic wave device, especially the insertion loss, are worsened.

Thus, it has been difficult to adjust the frequency shift exceeding 500 ppm by fine-tuning the frequency of the surface acoustic wave device via a dry etching method using plasma. This is because the plasma damages the piezoelectric body, which consequently deteriorates the insertion loss of the surface acoustic wave device.

Stepper exposure equipment is usually used in forming the interdigital electrode. It is impossible in this case to absorb the piezoelectric plate by using the stepper due to stress of the electrode film when the electrode film is deposited, often making it impossible to securely irradiate the light. Consequently, eliminating or preventing the stress described above has been attempted by reducing the deposition rate of the electrode film or by increasing the deposition pressure. However, these attempted solutions to the problems as described above resulted in poor throughput, inferior crystallinity or increased resistivity of the electrode film.

SUMMARY OF THE INVENTION

In order to overcome the problems described above, preferred embodiments of the present invention provide a surface acoustic wave device having an interdigital electrode including tantalum, wherein an adhesive property of the interdigital electrode for adhering to the piezoelectric plate is excellent, the cost as well as resistivity of the interdigital electrode are greatly reduced, and the insertion loss is greatly improved, and also provide a method for manufacturing such a novel surface acoustic wave device.

A surface acoustic wave device according to preferred embodiments of the present invention preferably includes a piezoelectric plate and at least one interdigital electrode provided on the piezoelectric plate, wherein the interdigital electrode includes a first metallic thin film defining a substrate and a second metallic thin film laminated on the first metallic thin film and containing tantalum as a principal component, and wherein at least a portion of the second metallic thin film is α-tantalum.

In one of the novel features of preferred embodiments of the present invention, at least a portion of the first metallic thin film includes titanium.

In another feature of preferred embodiments of the present invention, the first metallic thin film preferably includes a laminated metallic film formed by laminating a plurality of metallic thin films, and at least a portion of the thin metallic film at the side of the laminated metallic film where the second metallic thin films are laminated includes titanium.

The metallic thin film other than the metallic thin film to be laminated with the second metallic thin film of the laminated metallic thin film preferably includes a metal containing Au, α-tantalum, β-tantalum, W, Ag, Mo, Cu, Ni, Fe, Cr or Zr as a principal component.

Preferably, the thickness of the first metallic thin film is about 3 nm or more in at least one preferred embodiment of the present invention.

The first metallic thin film and the second metallic thin film are deposited by sputtering or vapor deposition in the method for manufacturing the surface acoustic wave device according to a preferred embodiment of the present invention.

In the method for manufacturing the surface acoustic wave device according to various preferred embodiments of the present invention, the interdigital electrode preferably includes a multilayer structure having a thin film of tantalum and a substrate thin film to accelerate the thin film of tantalum to be converted into α-tantalum.

While it was known in the art to use tantalum as an electrode of the surface acoustic wave device, use of α-tantalum was not known previously and only the use of β-tantalum was known.

It is known in the art that α-tantalum has low resistance (Sinku Vol. 24, No. 4, p240, 1981).

It is also known in the art that α-tantalum may be deposited when the tantalum film is deposited on a material having a body-centered cubic lattice structure with a lattice constant that is identical or similar to the lattice constant of α-tantalum (Japanese Unexamined Patent Application Publication No. 3-248568).

However, neither use of α-tantalum for the interdigital electrode, nor acceleration of conversion of a tantalum film into α-tantalum when the tantalum film is deposited on the thin titanium film has not been known in the art yet.

The surface acoustic wave device according to preferred embodiments of the present invention includes a first metallic thin film defining a substrate thin film and tantalum, and the interdigital electrode includes a second metallic thin film that is preferentially converted into α-tantalum as will be described hereinafter. Consequently, not only resistivity can be reduced, but also adhesive strength of the interdigital electrode to the piezoelectric plate can be effectively improved, in addition to effectively reducing bending of the substrate after deposition of the electrode. Resistivity of the entire interdigital electrode can be decreased besides reducing the insertion loss of the surface acoustic wave device according to preferred embodiments of the present invention, since the first metallic thin film is formed on the piezoelectric plate defining a substrate, and the tantalum film that is converted into α-tantalum is deposited on the first metallic thin film.

A material such as titanium having an excellent adhesive strength for adhering to the piezoelectric plate can be used for the first metallic thin film, thereby enabling the adhesive strength of the piezoelectric plate to the interdigital electrode to be greatly improved.

Deterioration of characteristics of the surface acoustic wave device under a high temperature and high humidity environment is prevented since α-tantalum is a stable substance.

In addition, bending of the piezoelectric plate after depositing the electrode is prevented by forming the first metallic thin film followed by depositing the tantalum film on the first metallic thin film. Accordingly, the deposition speed of the tantalum film is increased to enable throughput of manufacturing to be improved.

Lowering the insertion loss gives a margin to the insertion loss to enable the tuning range of the center frequency of the surface acoustic wave device to be expanded, or the yield of the surface acoustic wave device to be increased.

Accordingly, preferred embodiments of the present invention provide a cheap and reliable surface acoustic wave device having a wide tuning range of the frequency, wherein the insertion loss is improved and characteristics under a high temperature and high humidity environment are not deteriorated.

The adhesive strength of the interdigital electrode to the piezoelectric plate is improved when at least a portion of the first metallic thin film includes titanium, because titanium has an excellent adhesive property for adhering to the piezoelectric plate. In addition, conversion of the second metallic thin film to α-tantalum is securely accelerated to further reduce the insertion loss, when the tantalum film is deposited on titanium to define the second metallic thin film.

Conversion of the second metallic thin film to α-tantalum is securely accelerated as well to further reduce the insertion loss, when the first metallic thin film includes a laminated metallic thin film, and when at least a portion of the metallic thin film at the side where the second metallic thin film is laminated includes titanium.

When the first metallic thin film includes a laminated metallic film, and the remaining metallic thin films excluding the metallic thin film at the side where the second metallic thin film is laminated preferably include Au, α-Ta, β-Ta, W, Ag, Mo, Cu, Ni, Fe or Zr as a principal component, the electromechanical coupling coefficient is greatly increased to effectively reduce the insertion loss of the surface acoustic wave device.

Conversion of the tantalum film into α-tantalum can be accelerated in addition to effectively reducing the resistivity of the entire interdigital electrode by depositing the tantalum film as the second metallic thin film on the first metallic thin film while depositing the first metallic thin film at a thickness of about 3 nm or more.

In the method for manufacturing the surface acoustic wave device according to preferred embodiments of the present invention, the first metallic thin film and the second metallic thin film are deposited on the piezoelectric plate by sputtering or vapor deposition. Conversion of the second metallic thin film into α-tantalum is accelerated by depositing the second metallic thin film including tantalum as a principal component on the first metallic thin film, thereby enabling the surface acoustic wave device according to preferred embodiments of the present invention to be obtained using a common technique such as sputtering or vapor deposition.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
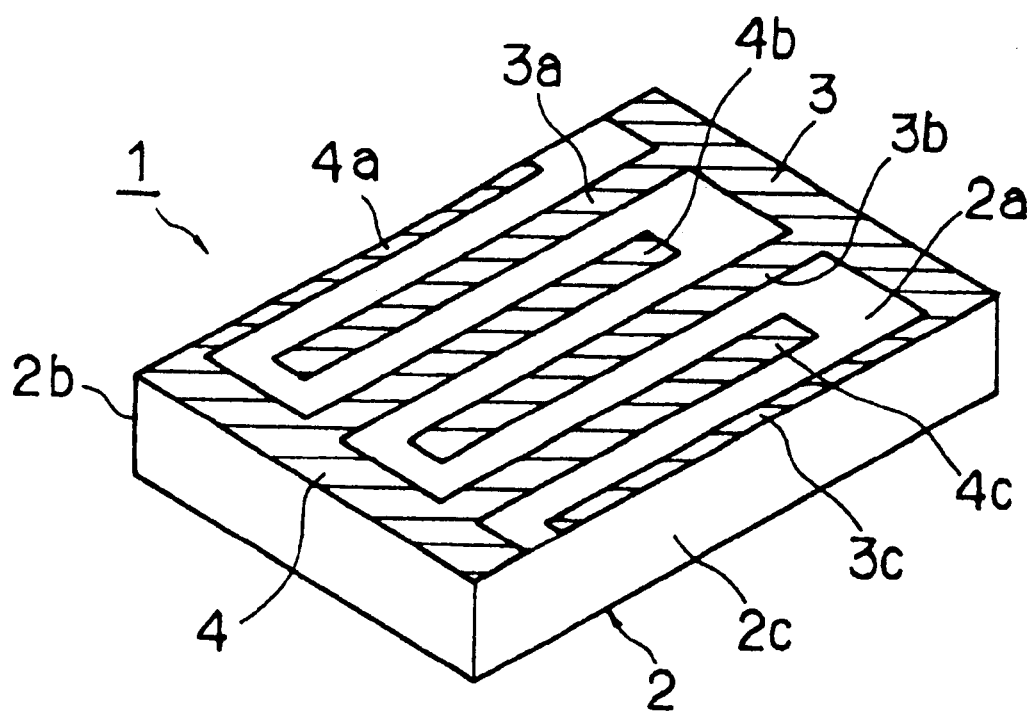
FIG. 1 shows a perspective view of the surface acoustic wave device according to a preferred embodiment of the present invention.
Figure 2:
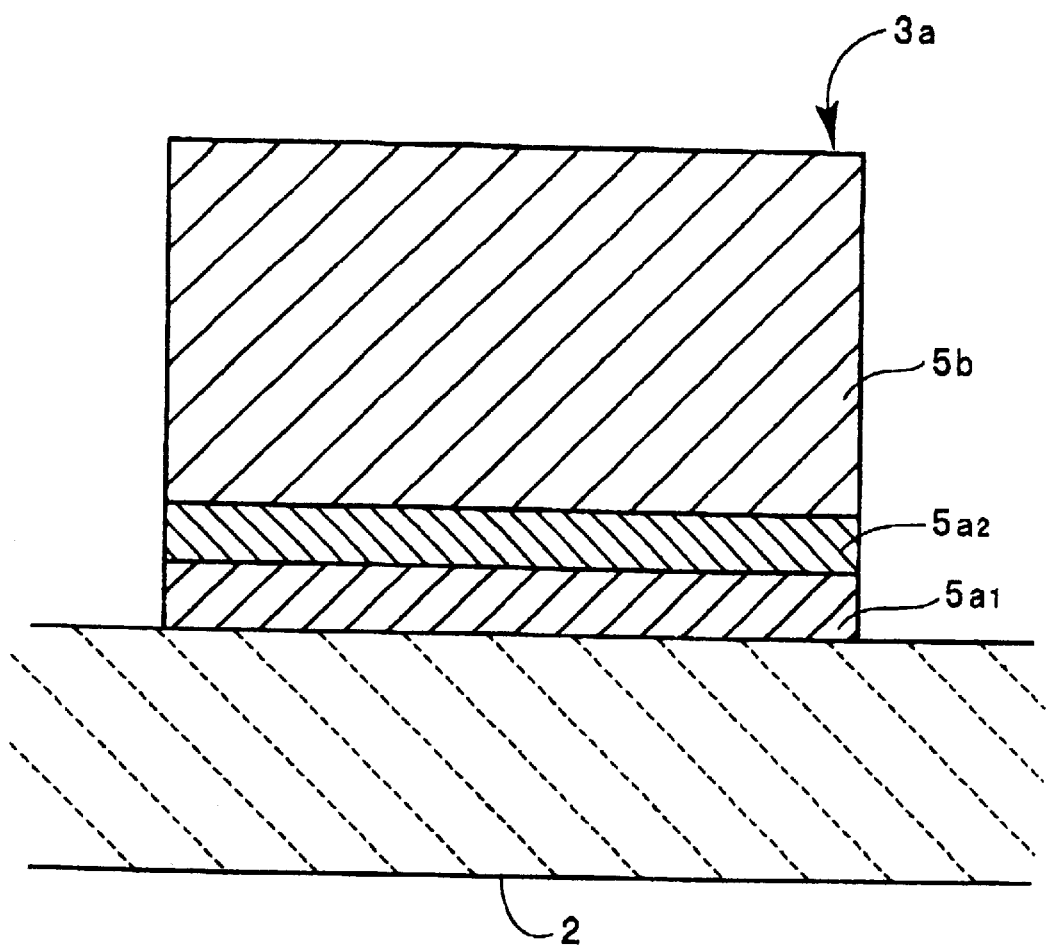
FIG. 2 shows a cross-section illustrating the laminated structure of the interdigital electrode of the surface acoustic wave device in the preferred embodiment shown in FIG. 1.

FIGS. 1 and 2 show a perspective view and a partially cut-off cross-section, respectively, of the surface acoustic wave device according to a preferred embodiment of the present invention.

The surface acoustic wave device 1 in this preferred embodiment is preferably an end-surface reflection type surface acoustic wave resonator utilizing an SH wave such as a Love wave. A quartz rotated Y-plate is used for a piezoelectric plate 2 in the surface acoustic wave device 1. At least one interdigital electrode including comb electrodes 3 and 4 is provided on the piezoelectric plate 2.

The comb electrodes 3 or 4 have a plurality of electrode fingers 3a to 3c and 4a to 4c, respectively. The electrode fingers 3a to 3c are inserted between corresponding two electrode fingers 4a to 4c.

The surface acoustic wave propagates toward a direction that is substantially perpendicular to the elongation direction of the electrode fingers 3a to 3c and 4a to 4c in the surface acoustic wave device 1. The width of the electrode fingers 4a and 3c located at both ends along the propagation direction of the surface wave is preferably about λ/8. The letter λ denotes the wavelength of the oscillated SH-type surface wave. The width of the other electrode fingers 3a, 3b, 4b, and 4c are all preferably about λ/2, while all the distances between the corresponding electrode fingers are preferably about λ/2.

Characteristics as a resonator can be obtained in the surface acoustic wave device 1 by reflecting the surface acoustic wave between the two opposed end surfaces 2b and 2c of the piezoelectric plate 2.

FIG. 2 is a partially cut-off cross-section showing the structure of the electrode finger 3a of the comb electrode 3 of the surface acoustic wave device 1 according to preferred embodiments of the present invention. A second metallic thin film 5b including tantalum is laminated on a first metallic thin film 5a in the comb electrode 3. The first metallic thin film 5a preferably includes a laminated metallic film having a bi-layer structure of a lower tungsten thin film $5a_1$, and an upper titanium thin film $5a_2$. While the second metallic thin film 5b is deposited on the titanium thin film $5a_2$, the second metallic thin film is converted into α-tantalum as will be made clear in the example of a preferred embodiment of the present invention to be described hereinafter.

The comb electrode 4 preferably has the same laminated structure as described above. That is, the features of this preferred embodiment include the interdigital electrode having the laminated structure as described above.

Accordingly, resistivity of the IDT electrode as well as the insertion loss are minimized while enhancing adhesive strength of the IDT electrode to the piezoelectric plate 2. The features described above will be described based on various preferred embodiments of the present invention.

A β-tantalum film is usually formed when a tantalum film is directly formed by sputtering on the piezoelectric plate. However, as will be described hereinafter, conversion of tantalum into α-tantalum is accelerated by depositing the tantalum film on a titanium thin film by vapor deposition or sputtering after forming a substrate thin film such as the titanium thin film.

Figure 3:
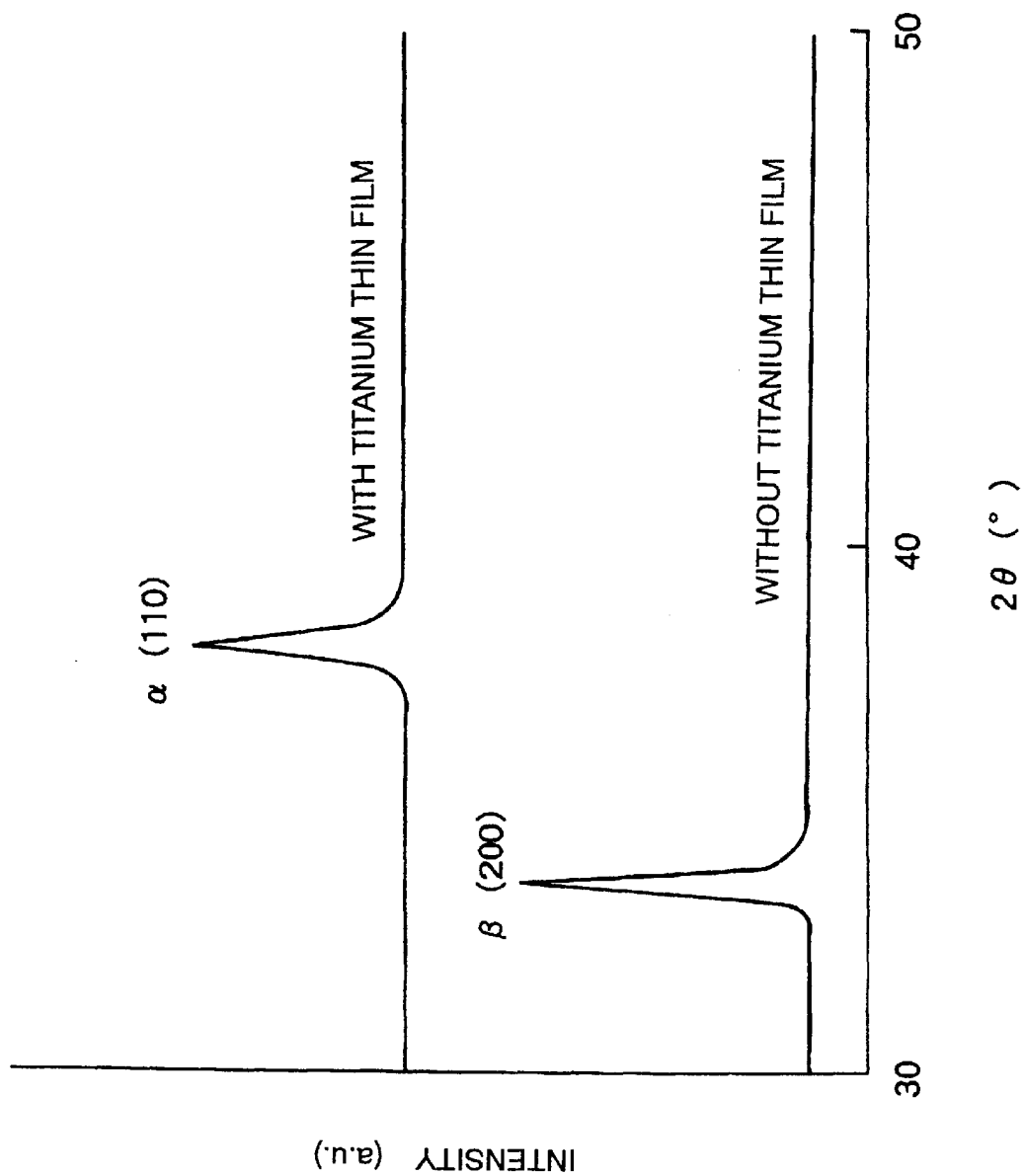
FIG. 3 shows XRD spectral data of the tantalum films when the tantalum film is deposited without forming the titanium thin film as a substrate on the piezoelectric plate, and when the tantalum film is deposited on the titanium thin film after depositing the titanium thin film.

FIG. 3 shows XRD spectral data of each tantalum film when the tantalum film is formed by direct sputtering of tantalum on the piezoelectric plate including a quartz rotation Y-plate, and when the tantalum film is formed by sputtering on the titanium thin film after forming the titanium thin film having a thickness of about 10 nm as a substrate thin film on the piezoelectric plate. The thickness of the tantalum film was adjusted to be about 100 nm in each case.

The peak denoted by (110) in FIG. 3 indicates that the film has an α-tantalum structure, while the peak denoted by (002) indicates that the film has a β-tantalum structure.

It is clear from FIG. 3 that the deposited tantalum film has an α-tantalum structure when it is deposited on the titanium thin film as the substrate, in contrast to the deposited tantalum film including a β-tantalum structure when no first metallic thin film having titanium has been deposited.

Figure 4:
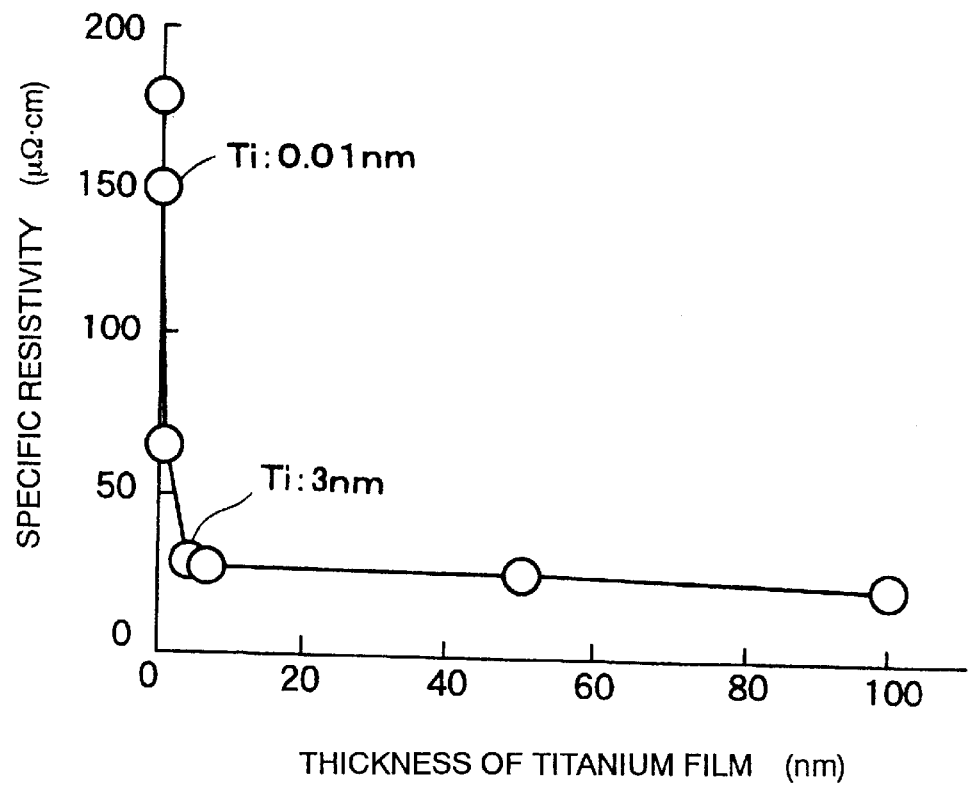
FIG. 4 shows a relationship between the thickness of the titanium thin film and the resistivity of the tantalum thin film when the titanium thin film is formed as the first metallic thin film on the piezoelectric plate, followed by depositing the tantalum film on the titanium thin film by sputtering.

The relationship between the thickness of the titanium thin film and the resistivity of the tantalum film is shown in FIG. 4, wherein the titanium thin film is formed as the first metallic thin film as a substrate, and a tantalum film with a thickness of about 100 nm is deposited by sputtering on the titanium thin film. FIG. 4 shows that the resistivity of the tantalum film can be reduced from about 180 μΩ·cm to about 25 μΩ·cm by forming the titanium thin film as the first metallic thin film, because the tantalum thin film has been converted into α-tantalum.

It is made clear that a thickness of the titanium thin film of at least approximately 3 nm is sufficient for converting the tantalum film into α-tantalum by depositing the tantalum film on the titanium thin film as described above.

TABLE 1 below shows the relationship between resistivity of the interdigital electrode and insertion loss of the surface acoustic wave device 1. In the surface acoustic wave device 1, the interdigital electrode including comb electrodes 3 and 4 are formed on the piezoelectric plate 2 made of a quartz substrate with a length of about 2 mm, a width of about 3 mm and a thickness of about 0.6 mm so that the electrode fingers have a logarithm value of 40 and λ-value of about 20 μm. Resistivity of the interdigital electrode was adjusted by adjusting the thickness of the titanium thin film when the tantalum film with a thickness of about 250 nm is deposited on the titanium thin film used as the first metallic thin film. It is clear from TABLE 1 that lower resistivity also causes the insertion loss to be very low.

TABLE 1

| RESISTIVITY [μΩ · cm] | 25 | 85 | 120 | 150 | 180 |
|---|---|---|---|---|---|
| INSERTION LOSS [db] | 2.9 | 4.1 | 5.2 | 5.6 | 8.3 |

TABLE 2 below shows the insertion loss of the surface acoustic wave devices including (1) a tantalum film directly deposited on the piezoelectric plate, (2) a tantalum film deposited on a titanium thin film after depositing the titanium film with a thickness of about 5 nm as the first metallic thin film on the piezoelectric plate 2, and (3) a tantalum film deposited on a titanium film after depositing a laminated metallic film as the first metallic thin film comprising a tungsten tin film and a titanium thin film.

TABLE 2

| CONSTRUCTION OF INTERDIGITAL FILM | INSERTION LOSS |
|---|---|
| β-TANTALUM | 8.3 |
| α-TANTALUM/TITANIUM | 2.9 |
| α-TANTALUM/TITANIUM/TUNGSTEN | 2.1 |

TABLE 2 shows that insertion loss of the surface acoustic wave device can be reduced by forming the first metallic thin film. It is also evident that insertion loss can be further reduced by forming the first metallic thin film with a laminated metallic film having a bi-layer structure including a tungsten thin film and a titanium thin film.

Although examples when the first metallic thin film includes a titanium thin film or a laminated metallic film of a tungsten thin film and a titanium thin film have been described with reference to FIGS. 3 and 4, and TABLES 1 and 2, the insertion loss may be effectively reduced as well by using a laminated metallic film including a titanium thin film and a metallic thin film made of another metal having a high electromechanical coupling coefficient such as a Au, α-Ta, β-Ta, Ag, MO, Cu, Ni, Fe, Cr or Zr thin film as the first metallic thin film.

When the first metallic thin film includes a laminated metallic film, three or more of the metallic thin films may be laminated. The metallic thin film including titanium is placed on the side where the second metallic thin film including tantalum is laminated. The two or more metallic thin films to be disposed below the metallic thin film including titanium may be made of any one of the metals having a high electromechanical coupling coefficient to effectively reduce the insertion loss.

The two or more metallic thin films to be disposed below the metallic thin film including titanium may be made of a combination of different metals.

One example of sputtering conditions, when the first metallic thin film includes the titanium thin film and the tantalum film is deposited on the first metallic thin film, is as follows:
(1) target: tantalum, titanium;
(2) sputtering gas: argon;
(3) gas pressure in the deposition chamber: 0.15 to 0.8 Pa;
(4) electric power for sputtering: 1 to 4 kW; and
(5) substrate temperature: room temperature to 350° C.

Argon as well as helium, neon, krypton or xenon may be used for the sputtering gas.

One example of sputtering conditions, when the first metallic thin film includes titanium and the tantalum film is deposited on the titanium thin film by electron beam vapor deposition, is as follows:
(1) ingot: tantalum, titanium;
(2) gas pressure in the deposition chamber: 5×10$^{-4}$ Pa or less;
(3) impressed voltage: tantalum; 8 kW, titanium; 2 kW; and
(4) substrate temperature: room temperature to 300° C.

Figure 5:
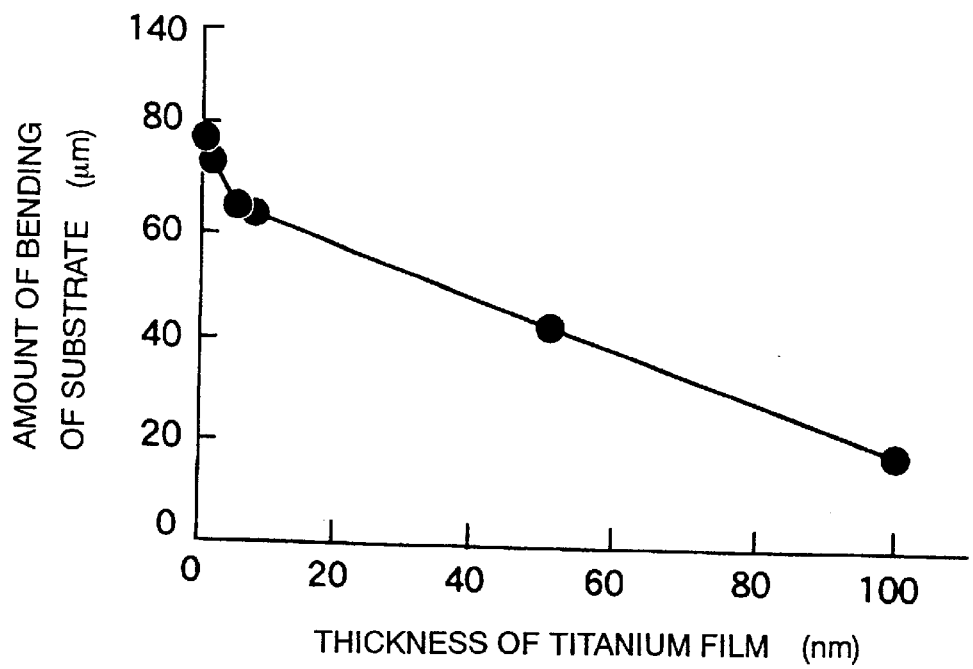
FIG. 5 shows a relationship between the thickness of the titanium thin film as the first metallic thin film, and bending of the piezoelectric plate after depositing the tantalum film as the second metallic thin film in a preferred embodiment of the present invention.

FIG. 5 shows the relationship between bending of the piezoelectric plate and the thickness of the first metallic thin film as a substrate, when the first metallic thin film is formed on the titanium thin film on which the tantalum film is deposited. FIG. 5 shows that bending of the piezoelectric plate can be reduced by forming the titanium film as the first metallic thin film that functions as a substrate.

The titanium thin film with a thickness of about 5 nm as the first metallic thin film that functions as the substrate was formed on the quartz plate defining a piezoelectric plate, and the tantalum film was formed on the titanium thin film under the foregoing conditions. A surface acoustic wave device was obtained by converting the tantalum film into α-tantalum. The thickness of the titanium thin film was about 5 nm while the thickness of the tantalum thin film was about 250 nm. The electrode fingers of the interdigital electrode had a logarithm value of 40 and λ-values of about 20 μm. A humidity resistance test and an adhesive strength test of the surface acoustic wave device was carried out as follows:

(1) Humidity resistance test: The surface acoustic wave device was allowed to stand for 100 hours in an environment of 85% relative humidity at 85° C. Resistance of the electrode was measured at prescribed time intervals to obtain the change of resistance of the electrode relative to that before the humidity resistance test; and (2) Adhesive strength test: The interdigital electrode formed on the quartz board was scratched with a scratch tester (made by RHESCA CO., type CSR-02) for evaluation.

Figure 6:
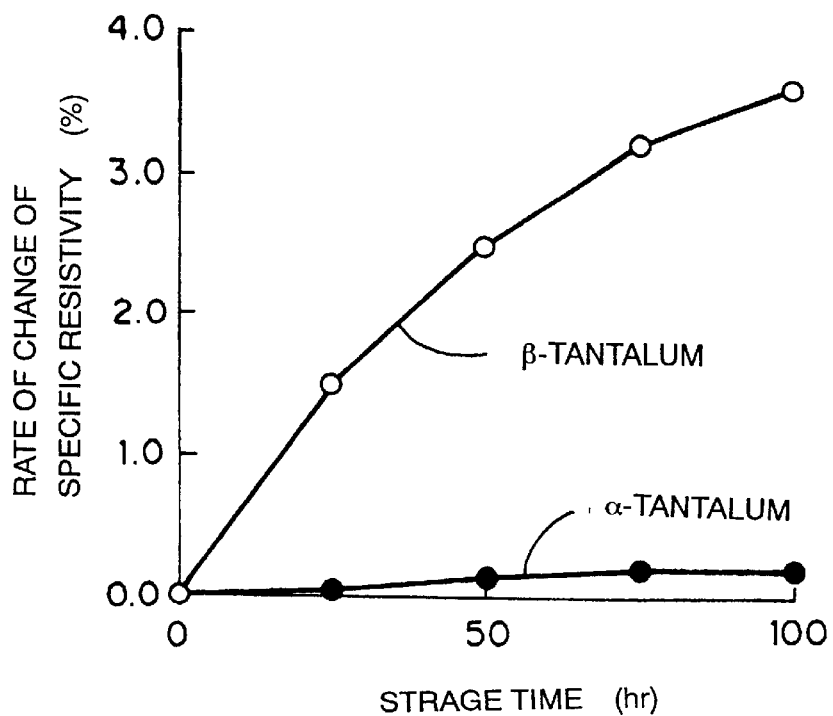
FIG. 6 shows the result of the humidity resistance test with respect to the surface acoustic wave devices in the example of preferred embodiments of the present invention and in Comparative Examples 1 and 2.
Figure 7:
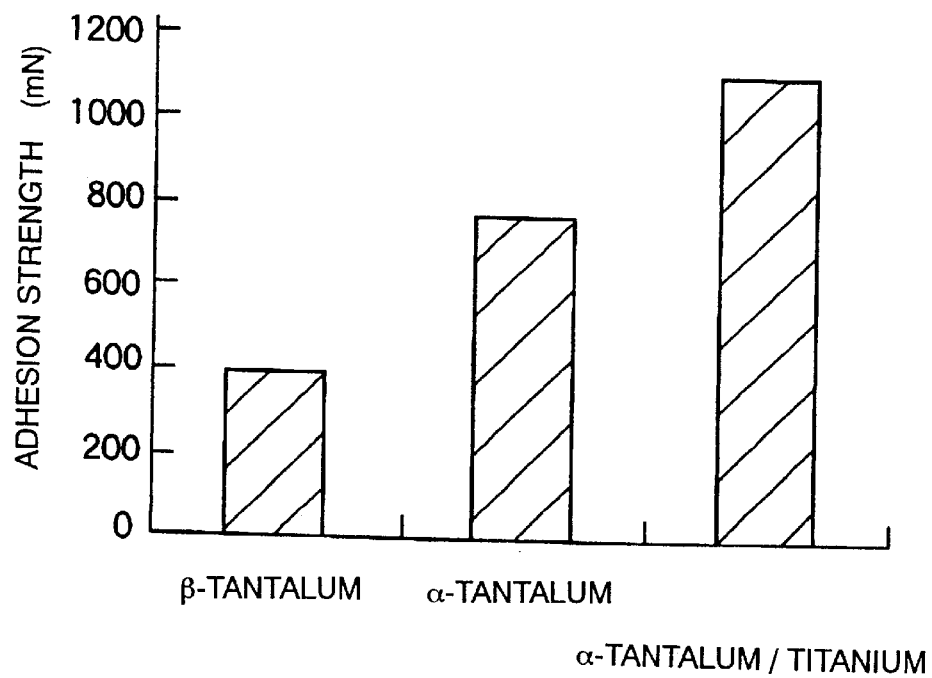
FIG. 7 shows the result of the adhesive strength test of the interdigital electrode to the piezoelectric plate with respect to the surface acoustic wave devices in the example of preferred embodiments of the present invention and in Comparative Examples 1 and 2.

The results of (1) humidity resistance test and (2) adhesive strength test are shown in FIGS. 6 and 7, respectively.

The same test as described above was also carried out for comparison with respect to a surface acoustic wave device having the same construction as described above except the construction of the interdigital electrode, or a surface acoustic wave device having an interdigital electrode including only the β-tantalum film.

As is made clear from FIGS. 6 and 7, humidity resistance as well as adhesive strength of the electrode to the piezoelectric plate are effectively enhanced in the preferred embodiment in which the titanium thin film is formed as a substrate besides depositing the tantalum film on the titanium thin film, as compared with the surface acoustic wave device having the interdigital electrode including only the α-tantalum film or the β-tantalum film.

Frequency tuning procedures of the surface acoustic wave device 1 according to this preferred embodiment will be described hereinafter. As described previously, it has been known that fine-tuning of the frequency of the surface acoustic wave device is possible by dry-etching using a plasma based on a mixed gas of $CF_4$ and $O_2$. Fine-tuning of the frequency is also possible in the surface acoustic wave device according to this preferred embodiment by dry-etching under the following conditions:

(1) etching gas: a mixed gas of $CF_4$ and $O_2$;
(2) etching gas pressure: 2 Pa;
(3) etching temperature: 60° C.; and
(4) electric power for etching: 500 W.

However, the etching conditions described above may be appropriately changed depending on the actual structure of the surface acoustic wave device 1. Fine-tuning is also possible in the surface acoustic wave device 1 according to this preferred embodiment by applying the dry-etching as described above.

Sound velocity and electromechanical coupling coefficient $k^2$ of the surface acoustic wave device can be tuned by adjusting the film thickness of the α-tantalum film in the surface acoustic wave device according to preferred embodiments of the present invention, which will described with reference to FIGS. 8 and 9.

Figure 8:
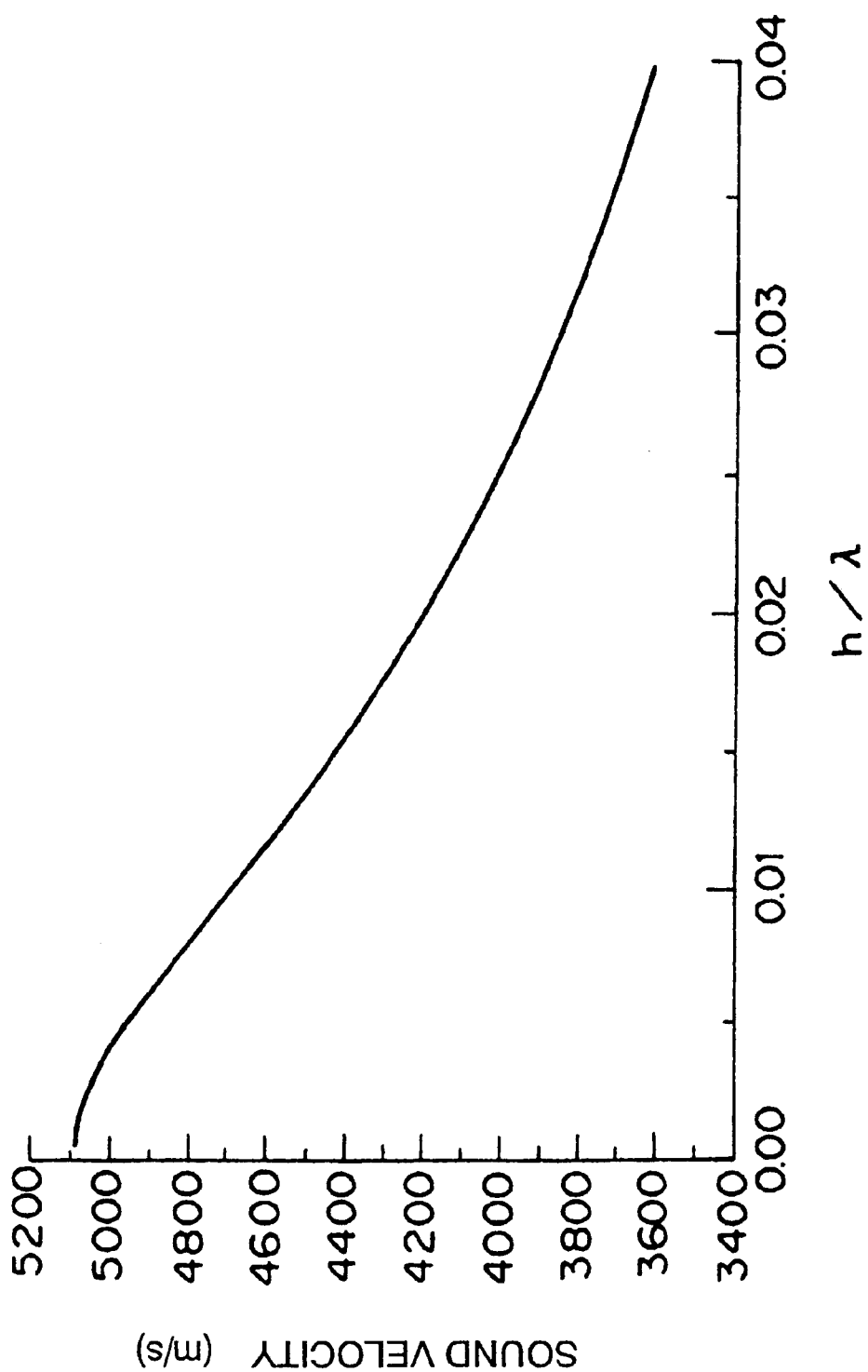
FIG. 8 shows the change of the sound velocity of the surface acoustic wave when α-tantalum films with various film thicknesses are formed on the quartz board with Euler's angles of (0, 127, 90).

FIG. 8 shows the change of sound velocity of the surface wave using a quartz rotation Y plate with Euler angles of (0, 127, 90) as the piezoelectric plate on which the α-tantalum films having various film thicknesses are formed. The horizontal axis and vertical axis in FIG. 8 represent the normalized film thickness h/λ (h represents the film thickness of the tantalum film and λ represents the wavelength of the surface wave) and the sound velocity (m/s) of the surface wave, respectively.

As is evident from FIG. 8, the sound velocity of the surface acoustic wave is reduced as the film thickness h/λ of the α-tantalum film is increased.

The relationship between the film thickness h/λ and the electromechanical coupling coefficient $k^2$ (%) of the α-tantalum film was determined based on the sound velocity of the surface wave. The electromechanical coupling coefficient $k^2$ in FIG. 9 was calculated using the following equation (1):

$$K^2 = 2 \times (V_0 - V_s)/V_0 \quad (1)$$

wherein $V_0$ denotes the sound velocity of the surface acoustic wave when the dielectric constant of the tantalum is assumed to be 1, and $V_s$ denotes the sound velocity of the surface wave when the dielectric constant of the tantalum is assumed to be zero.

Figure 9:
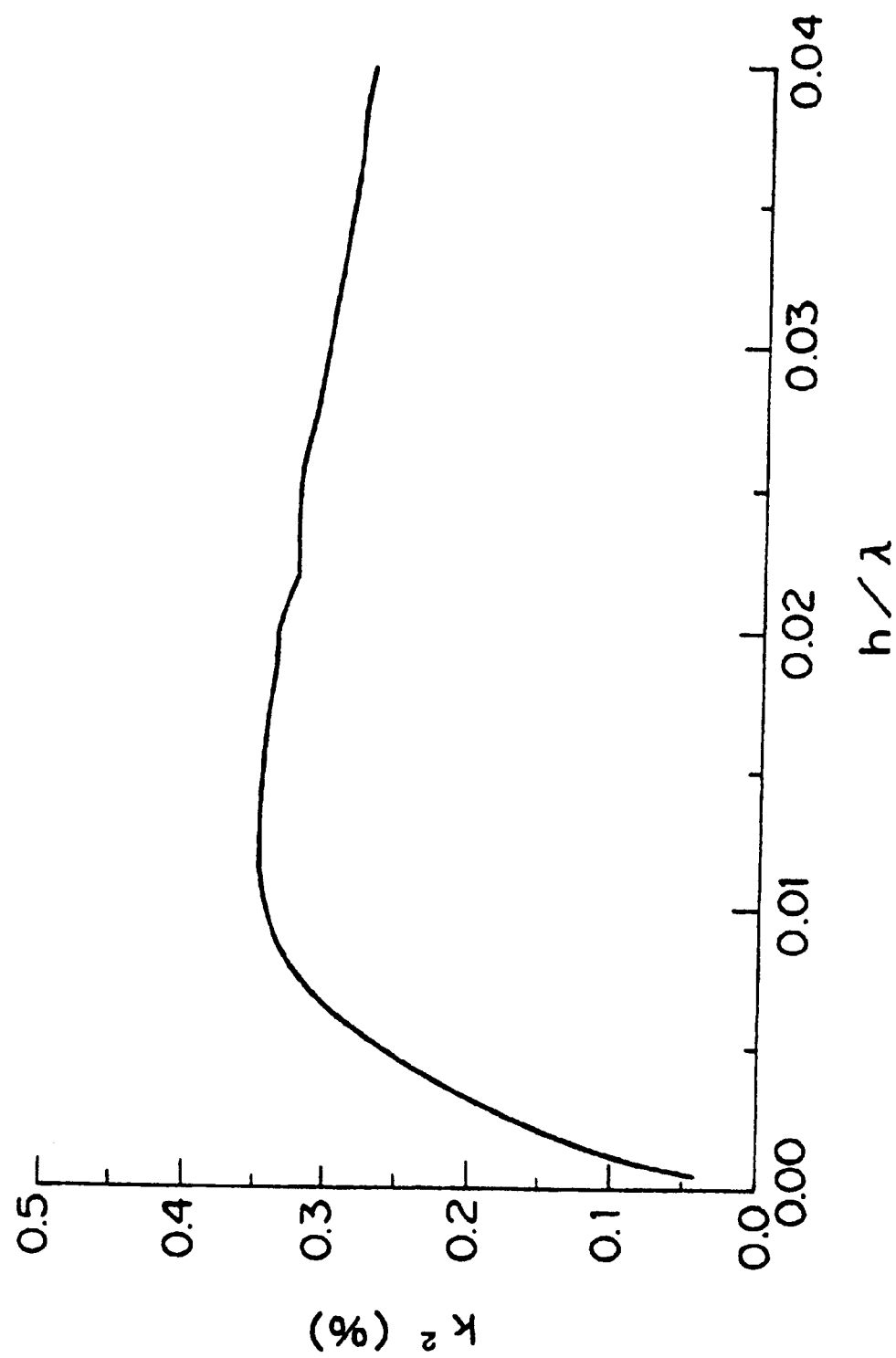
FIG. 9 shows a relationship between the film thickness of the α-tantalum film and the electromechanical coupling coefficient $k^2$ as determined from the relationship between the film thickness of the α-tantalum film and the sound velocity shown in FIG. 8.

FIGS. 8 and 9 show that fine-tuning of the sound velocity and electromechanical coupling coefficient is possible by changing the film thickness of the α-tantalum film in the surface acoustic wave device according to preferred embodiments of the present invention. Consequently, adjusting the film thickness enables frequency characteristics to be tuned together with tuning of the frequency by dry etching as hitherto described, enabling frequency characteristics of the surface acoustic wave device to be tuned over a wide frequency range.

While the end-surface reflection type surface acoustic wave device has been described in the foregoing preferred embodiments, the present invention can be also applied to surface acoustic wave devices other than the end-surface reflection type surface acoustic wave device. For example, the present invention can be applied to a surface acoustic wave device including reflectors at both sides of the interdigital electrode. The present invention can be further applied not only to the resonator but also to surface acoustic wave filters.

The surface acoustic wave used in the present invention is not limited to the SH-type surface wave such as the Love wave and many other surface acoustic waves may be used.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:

a piezoelectric plate; and
at least one interdigital electrode provided on the piezoelectric plate;
wherein the interdigital electrode includes a first metallic thin film and a second metallic thin film laminated on the first metallic thin film and including tantalum as a principal component, at least a portion of the tantalum of the second metallic thin film is α-tantalum.

2. A surface acoustic wave device according to claim 1, wherein at least a portion of the first metallic thin film includes titanium.

3. A surface acoustic wave device according to claim 1, wherein the first metallic thin film includes a laminated metallic film defined by a plurality of metallic thin films, and at least a portion of the thin metallic film at the side of the laminated metallic film where the second metallic thin film is laminated includes titanium.

4. A surface acoustic wave device according to claim 3, wherein the metallic thin film other than the metallic thin film laminated with the second metallic thin film of the laminated metallic thin film includes a metal containing Au, α-tantalum, β-tantalum, W, Ag, Mo, Cu, Ni, Fe, Cr or Zr as a principal component.

5. A surface acoustic wave device according to claim 1, wherein the thickness of the first metallic thin film is about 3 nm or more.

6. A surface acoustic wave device according to claim 1, wherein the piezoelectric plate and the at least one interdigital electrode are arranged to utilize shear horizontal waves.

7. A surface acoustic wave device according to claim 1, wherein the at least one interdigital electrode includes a plurality of electrode fingers interdigitated with each other, the width of the electrode fingers located at both ends along the propagation direction of the surface acoustic wave is about λ/8, where λ denotes the wavelength of the surface acoustic wave.

8. A surface acoustic wave device according to claim 1, wherein the at least one interdigital electrode includes a plurality of electrode fingers interdigitated with each other, the width of the electrode fingers located in between both ends along the propagation direction of the surface acoustic wave is about λ/2, where λ denotes the wavelength of the surface acoustic wave.

9. A surface acoustic wave device according to claim 1, wherein the at least one interdigital electrode includes a plurality of electrode fingers interdigitated with each other, and the distances between adjacent ones of the corresponding electrode fingers are about λ/2, where λ denotes the wavelength of the surface acoustic wave.

10. A surface acoustic wave device according to claim 1, further comprising reflectors provided at ends of the piezoelectric plate to reflect surface acoustic waves therebetween.

* * * * *